(12) United States Patent
Kishimoto et al.

(10) Patent No.: US 9,543,444 B2
(45) Date of Patent: Jan. 10, 2017

(54) OXIDE SPUTTERING TARGET, AND THIN FILM TRANSISTOR USING THE SAME

(71) Applicant: SAMSUNG DISPLAY CO., LTD., Yongin, Gyeonggi-Do (KR)

(72) Inventors: Katsushi Kishimoto, Hwaseong-si (KR); Yoshinori Tanaka, Hwaseong-si (KR); Yeon Keon Moon, Seoul (KR); Sang Woo Sohn, Yongin-si (KR); Sang Won Shin, Yongin-si (KR); Takayuki Fukasawa, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/487,916

(22) Filed: Sep. 16, 2014

(65) Prior Publication Data

US 2015/0255611 A1 Sep. 10, 2015

(30) Foreign Application Priority Data

Mar. 6, 2014 (KR) .................. 10-2014-0026722

(51) Int. Cl.
*H01L 29/786* (2006.01)
*H01L 29/26* (2006.01)
*H01J 37/34* (2006.01)

(52) U.S. Cl.
CPC ....... *H01L 29/7869* (2013.01); *H01J 37/3429* (2013.01); *H01J 37/3491* (2013.01)

(58) Field of Classification Search
CPC ... H01L 29/7869; H01L 29/26; H01J 37/3491; H01J 37/3429
USPC ........................................ 257/43; 204/298.13
See application file for complete search history.

(56) References Cited

U.S. PATENT DOCUMENTS

| 2006/0099140 A1* | 5/2006 | Abe ........................ C04B 35/01 423/594.13 |
| 2010/0155717 A1* | 6/2010 | Yano .................... C23C 14/086 257/43 |
| 2014/0102877 A1* | 4/2014 | Yamazaki ............. C30B 23/005 204/192.15 |

FOREIGN PATENT DOCUMENTS

| JP | 2008-192721 | 8/2008 |
| JP | 2008-214697 | 9/2008 |
| KR | 10-2013-0018300 | 2/2013 |
| KR | 10-2013-0097809 | 9/2013 |
| KR | 10-2013-0102628 | 9/2013 |

* cited by examiner

*Primary Examiner* — Cuong Q Nguyen
*Assistant Examiner* — Tong-Ho Kim
(74) *Attorney, Agent, or Firm* — F. Chau & Associates, LLC

(57) ABSTRACT

An oxide sputtering target includes at least one of indium (In), zinc (Zn), tin (Sn), and gallium (Ga), and tungsten (W) in an amount from 0.005 mol % to 1 mol %.

4 Claims, 11 Drawing Sheets

OXIDE SPUTTERING TARGET, AND THIN FILM TRANSISTOR USING THE SAME

CROSS-REFERENCE TO RELATED APPLICATION

This application claims priority to Korean Patent Application No. 10-2014-0026722 filed on Mar. 6, 2014, the disclosure of which is hereby incorporated by reference herein in its entirety.

(a) TECHNICAL FIELD

The present disclosure relates to an oxide sputtering target and a thin film transistor using the same.

(b) DISCUSSION OF THE RELATED ART

A thin film transistor (TFT) is currently used as a switching or driving element in a display sector, and has been applied to various fields of industry.

For example, an amorphous silicon thin film transistor (a-Si TFT) is used as a driving or switching element of a display device. The a-Si TFT is currently a widely used element that may be uniformly formed on a substrate at a low cost. The amorphous silicon is widely used, but due to its low charge mobility, there may be a limitation in manufacturing a high performance thin film transistor therewith. In addition, when using polysilicon as a semiconductor, the charge mobility may be high and thus manufacturing a high performance thin film transistor may be relatively easy, but there may be a limitation in manufacturing a large thin film transistor array panel by using such a thin film transistor because of its high cost and low uniformity.

Accordingly, research on a thin film transistor having high electron mobility and a high on/off ratio of current compared to amorphous silicon and low cost and high uniformity compared to polysilicon is currently being carried out.

Recently, an oxide semiconductor element such as ZnO, IZO (InZnO), GIZO (GaInZnO), IZTO (InZnSnO), etc. has been in the spotlight. By being manufactured by a low temperature process and in an amorphous phase, the oxide semiconductor element may be formed in a large area. Currently, research on using an oxide semiconductor material layer having high mobility, which is an oxide-based material layer, in a channel region of the thin film transistor is being carried out.

SUMMARY

Exemplary embodiments of the present invention provide an oxide sputtering target having a high density, and a thin film transistor with a minimized threshold voltage shift.

An oxide sputtering target according to an exemplary embodiment of the present invention includes at least one of indium (In), zinc (Zn), tin (Sn), and gallium (Ga), and tungsten (W) in an amount from 0.005 mol % to 1 mol %.

An indium content may be from 10 mol % to 60 mol %, a zinc content may be from 10 mol % to 65 mol %, and a tin content may be 0.1 mol % to 60 mol %.

An oxide sputtering target according to an exemplary embodiment of the present invention includes at least one of indium (In), zinc (Zn), tin (Sn), and gallium (Ga), and niobium (Nb) in an amount from 0.01 mol % to 1 mol %.

An indium content may be from 10 mol % to 60 mol %, a zinc content may be from 10 mol % to 65 mol %, and a tin content may be from 0.1 mol % to 60 mol %.

An oxide sputtering target according to an exemplary embodiment of the present invention includes at least one of thallium (Tl), indium (In), zinc (Zn), tin (Sn), and gallium (Ga), and tungsten (W) in an amount from 0.005 mol % to 0.1 mol %.

A sum of contents of thallium and indium may be 10 mol % to 60 mol %, a zinc content may be from 10 mol % to 65 mol %, and a tin content may be from 0.1 mol % to 60 mol %.

An oxide sputtering target according to an exemplary embodiment of the present invention includes at least one of thallium (Tl), indium (In), zinc (Zn), tin (Sn), and gallium (Ga), and niobium in an amount from 0.001 mol % to 1 mol %.

A sum of contents of thallium and indium may be from 10 mol % to 60 mol %, a zinc content may be from 10 mol % to 65 mol %, and a tin content may be from 0.1 mol % to 60 mol %.

A thin film transistor according to an exemplary embodiment of the present invention includes: a gate electrode, a source electrode, a drain electrode disposed at the same layer as the source electrode and facing the source electrode, an oxide semiconductor layer disposed between the gate electrode and at least one of the source electrode and the drain electrode, and a gate insulating layer disposed between the gate electrode and at least one of the source electrode and the drain electrode. The oxide semiconductor layer includes at least one of indium (In), zinc (Zn), tin (Sn), and gallium (Ga), and tungsten (W) in an amount from 0.005 mol % to 1 mol %. The oxide semiconductor layer is formed using an oxide sputtering target, and the oxide semiconductor layer has the same chemical composition as the oxide sputtering target.

An indium content of the oxide semiconductor layer may be from 10 mol % to 60 mol %, a zinc content may be from 10 mol % to 65 mol %, and a tin content may be from 0.1 mol % to 60 mol %.

A thin film transistor according to an exemplary embodiment of the present invention includes: a gate electrode, a source electrode, a drain electrode disposed at the same layer as the source electrode and facing the source electrode, an oxide semiconductor layer disposed between the gate electrode and at least one of the source electrode and the drain electrode, and a gate insulating layer disposed between the gate electrode and at least one of the source electrode and the drain electrode. The oxide semiconductor layer includes at least one of indium (In), zinc (Zn), tin (Sn), and gallium (Ga), and niobium in an amount from 0.01 mol % to 1 mol %. The oxide semiconductor layer is formed using an oxide sputtering target, and the oxide semiconductor layer has the same chemical composition as the oxide sputtering target.

An indium content of the oxide semiconductor layer may be from 10 mol % to 60 mol %, a zinc content may be from 10 mol % to 65 mol %, and a tin content may be from 0.1 mol % to 60 mol %.

A thin film transistor according to an exemplary embodiment of the present invention includes: a gate electrode, a source electrode, a drain electrode disposed at the same layer as the source electrode and facing the source electrode, an oxide semiconductor layer disposed between the gate electrode and at least one of the source electrode and the drain electrode, and a gate insulating layer disposed between the gate electrode and at least one of the source electrode and the drain electrode. The oxide semiconductor layer includes at least one of thallium (Tl), indium (In), zinc (Zn), tin (Sn), and gallium (Ga), and tungsten (W) in an amount from 0.005 mol % to 0.1 mol %. The oxide semiconductor layer is formed using an oxide sputtering target, and the oxide semiconductor layer has the same chemical composition as the oxide sputtering target.

A sum of contents of thallium and indium in the oxide semiconductor layer may be from 10 mol % to 60 mol %, a zinc content may be from 10 mol % to 65 mol %, and a tin content may be from 0.1 mol % to 60 mol %.

A thin film transistor according to an exemplary embodiment of the present invention includes: a gate electrode, a source electrode, a drain electrode disposed at the same layer as the source electrode and facing the source electrode, an oxide semiconductor layer disposed between the gate electrode and at least one of the source electrode and the drain electrode, and a gate insulating layer disposed between the gate electrode and at least one of the source electrode and the drain electrode. The oxide semiconductor layer includes at least one of thallium (Tl), indium (In), zinc (Zn), tin (Sn), and gallium (Ga), and niobium in an amount from 0.001 mol % to 1 mol %. The oxide semiconductor layer is formed using an oxide sputtering target, and the oxide semiconductor layer has the same chemical composition as the oxide sputtering target.

A sum of contents of thallium and indium of oxide semiconductor layer may be from 10 mol % to 60 mol %, a zinc content may be from 10 mol % to 60 mol %, and a tin content may be from 0.1 mol % to 60 mol %.

A manufacturing method of an oxide sputtering target according to an exemplary embodiment of the present invention includes: mixing at least one powder selected from a group consisting of an indium oxide ($In_2O_3$) powder, a zinc oxide (ZnO) powder, a gallium oxide ($Ga_2O_3$) powder, a tin oxide ($Sn_2O_3$) powder, and a thallium oxide ($Tl_2O_3$) powder. The tungsten oxide powder has a diameter less than about 200 um. In addition, the method further includes sintering the mixed powder at a temperature from 1200° C. to 1500° C.

A manufacturing method of an oxide sputtering target according to an exemplary embodiment of the present invention includes: forming a zinc tungsten oxide ($ZnWO_4$) powder by using an alkali solution including zinc and tungsten ions, mixing at least one powder selected of a group consisting of an indium oxide ($In_2O_3$) powder, a zinc oxide (ZnO) powder, a gallium oxide ($Ga_2O_3$) powder, a tin oxide ($Sn_2O_3$) powder, and a thallium oxide ($Tl_2O_3$) powder, and the $ZnWO_4$ powder, and sintering the mixed powder at a temperature from 1200° C. to 1500° C.

A manufacturing method of an oxide sputtering target according to an exemplary embodiment of the present invention includes: mixing at least one powder selected from a group consisting of an indium oxide ($In_2O_3$) powder, a zinc oxide (ZnO) powder, a gallium oxide ($Ga_2O_3$) powder, a tin oxide ($Sn_2O_3$) powder, and a thallium oxide ($Tl_2O_3$) powder, positioning a tungsten wire on the mixed powder, and sintering the mixed powder and the tungsten wire at a temperature of 1200° C. to 1500° C.

A thin film transistor according to an exemplary embodiment of the present invention includes a substrate, a gate electrode disposed on a substrate, a gate insulating layer disposed on the gate electrode, an oxide semiconductor layer disposed on the gate insulating layer, an etch stopper disposed on a channel region of the oxide semiconductor layer, a source electrode and a drain electrode spaced apart from each other on the oxide semiconductor layer and overlapping an edge of the etch stopper, and a passivation layer disposed on the source electrode and the drain electrode and filling a space in which the source electrode and the drain electrode are spaced apart from each other and covering the etch stopper exposed through the space in which the source electrode and the drain electrode are spaced apart from each other. The oxide semiconductor layer includes at least one of indium (In), zinc (Zn), tin (Sn), and gallium (Ga), and tungsten (W) in an amount from 0.005 mol % to 1 mol %. The oxide semiconductor layer is formed using an oxide sputtering target, and the oxide semiconductor layer has the same chemical composition as the oxide sputtering target.

As described above, for the oxide sputtering target and the thin film transistor according to exemplary embodiments of the present invention, the sputtering target including indium, zinc, tin, gallium, and the additional thallium is doped with tungsten or niobium with the appropriate concentration to increase the density of the oxide sputtering target such that the threshold voltage shift of the semiconductor thin film formed as the target is minimized, thereby increasing the reliability of the thin film transistor.

BRIEF DESCRIPTION OF THE DRAWINGS

Exemplary embodiments of the present invention can be understood in more detail from the following detailed description when taken in conjunction with the attached drawings in which.

DETAILED DESCRIPTION OF EXEMPLARY EMBODIMENTS

Figure 1:
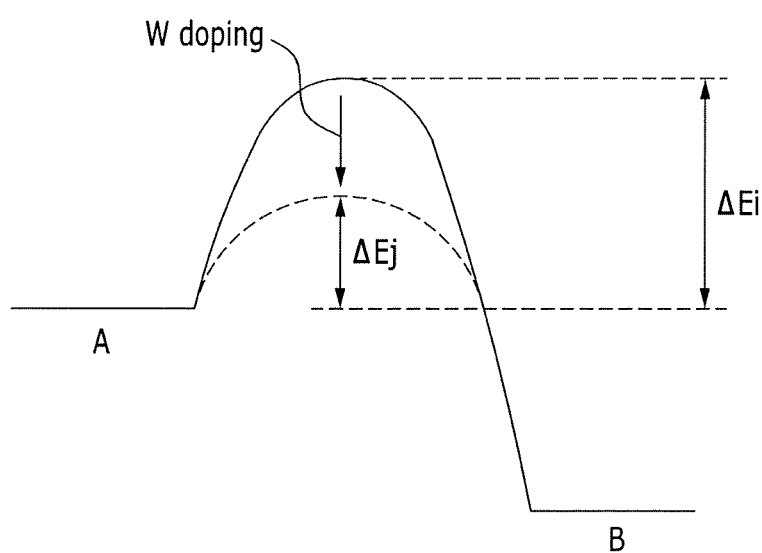
FIG. 1 is a view showing an activation energy change depending on tungsten doping.

Exemplary embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc. may be exaggerated for clarity. Like reference numerals designate like elements throughout the specification. It will be understood that when an element such as a layer, film, region, or substrate is referred to as being "on" another element, it can be directly on the other element or intervening elements may also be present.

As used herein, the singular forms, "a", "an", and "the" are intended to include plural forms as well, unless the context clearly indicates otherwise.

A sputtering target according to an exemplary embodiment of the present invention includes at least one among indium (In), zinc (Zn), tin (Sn), and gallium (Ga), and tungsten (W) is doped at 0.005 mol % to 1 mol %.

In the sputtering target according to an exemplary embodiment of the present invention, the content of indium may be from 10 mol % to 60 mol %. Further, the content of zinc may be from 10 mol % to 65 mol %. Moreover, the content of tin may be from 0.1 mol % to 60 mol %.

The oxide sputtering target may be manufactured by mixing powders of indium oxide ($In_2O_3$), zinc oxide (ZnO), gallium oxide ($Ga_2O_3$), tin oxide ($Sn_2O_3$), and tungsten oxide ($WO_3$) to be suitable for the ratio and sintering them at a high temperature. The diameter of the tungsten oxide powder may be less than 200 μm. Commonly, diameters of the other powders (indium oxide, etc.) may be less than 1 mm. That is, compared with the other composition powders forming the oxide sputtering target, the size of the doped tungsten oxide powder is small. Accordingly, while the tungsten oxide powder is positioned between the other powders, a uniform concentration is doped in the sintering.

Also, the oxide sputtering target may be manufactured by, for example, forming a zinc tungsten oxide ($ZnWO_4$) powder by using an alkali solution including zinc and tungsten ions, and mixing powders of indium oxide ($In_2O_3$), zinc oxide (ZnO), gallium oxide ($Ga_2O_3$), and tin oxide ($Sn_2O_3$) along with the $ZnWO_4$ powder to be suitable for the ratio and sintering them. In this case, the size of the $ZnWO_4$ powder is similar to the size of the other powders, thereby being uniformly mixed. Accordingly, the doping of tungsten may be uniformly generated.

Also, the oxide sputtering target may be manufactured by, for example, uniformly mixing powders of indium oxide ($In_2O_3$), zinc oxide (ZnO), gallium oxide ($Ga_2O_3$), and tin oxide ($Sn_2O_3$) and doping them by using tungsten vapor in the sintering step. In this method, a tungsten wire is positioned in a chamber in which the powder is sintered and is heated to, for example, 1200° C. to 1500° C. The tungsten vapor is emitted from the tungsten wire by the high temperature and is mixed with the powder, and the tungsten is uniformly doped in the sintering of the powder.

In the present exemplary embodiment of the present invention, the tungsten doping concentration of the oxide sputtering target may be from 0.005 mol % to 1 mol %.

In the sputtering target including indium, zinc, tin, and gallium, each of the atoms in the target may be arranged with a hexagonal close packed structure. In the hexagonal close packed structure, each particle forming the solid contacts different 12 particles and contacts 6 particles in the plane surface, and thereby a crystalline structure minimizing an empty space is formed. In a first layer, six particles are arranged while enclosing one center particle; in a second layer, three particles are arranged on a surface of the center particle forming a triangle; and in an overlying layer, the six particles again enclosing one center particle are arranged on the triangular particle surface.

If the sputtering target includes indium, zinc, tin, and gallium, the ratio of indium and tin is not the same in each layer of the hexagonal close packed structure. As one example, the ratio of tin of the first layer in the hexagonal close packed structure is 20%, the ratio of the second layer is 10%, and the ratio of the third layer is 35%, such that the ratios of the configuration atoms in each layer are different in this method.

The atom size of indium is 1.44 Å, and the atom size of tin is 1.40 Å. As the atom sizes are different, a difference between the adjacent layers is changed according to the ratios of indium and tin in each layer. Also, the ratio c/a of a distance a between the adjacent atoms in the first layer in the hexagonal close packed structure and a distance c between the first layer and the third layer is large compared with the hexagonal close packed structure made of a single material.

Accordingly, the density of the sputtering target is relatively decreased, and resistance of the sputtering target against an attack by external water ($H_2O$) or hydrogen $H_2$ is weak. This is the same in the semiconductor thin film formed by the sputtering target. The density of the formed thin film is decreased and the attack of the water or hydrogen is relatively easy between the atoms such that a deformation of the semiconductor thin film may be generated. This generates a shift of the threshold voltage when the above-mentioned semiconductor thin film formed by the sputtering target is used as the thin film transistor. That is, a value of the Vth Shift is increased.

In summary, the low density of the sputtering target generates the lower density of the semiconductor thin film of the thin film transistor manufactured therefrom, and the deformation by the external environment is relatively easily generated. Accordingly, the threshold voltage (Vth) of the formed thin film transistor is shifted. The Vth shift is a value affecting the reliability of the thin film transistor, thereby decreasing the reliability.

Accordingly, it is significant to increase the density of the sputtering target to increase the reliability of the thin film transistor.

In the present exemplary embodiment of the present invention, by doping tungsten at 0.005 mol % to 1 mol % to the oxide sputtering target to increase the density of the sputtering target, the reliability of the formed thin film transistor is increased.

The tungsten doping allows the ratio of indium and tin to be the same in each layer in the hexagonal close packed structure when the sputtering target includes indium, zinc, tin, and gallium.

FIG. 1 is a view showing an activation energy change according to tungsten doping.

Referring FIG. 1, the case that the ratio of indium and tin in each layer is different corresponds to A, and the case that the ratio of indium and tin in each layer is the same corresponds to B. To move to the state B from the state A, activation energy of ΔEi is required.

However, as shown in FIG. 1, when doping tungsten, tungsten is activated as a catalyst. Accordingly, the activation energy from the state A to the state B is decreased. Accordingly, in the case that the sputtering target includes indium, zinc, tin, and gallium, the ratio of indium and tin in each layer of the hexagonal close packed structure becomes the same by the tungsten doping. This is because the distance between the layers is decreased such that the ratio c/a is increased compared with the case that the tungsten is not doped. That is, the density of the sputtering target is increased.

Figure 2:
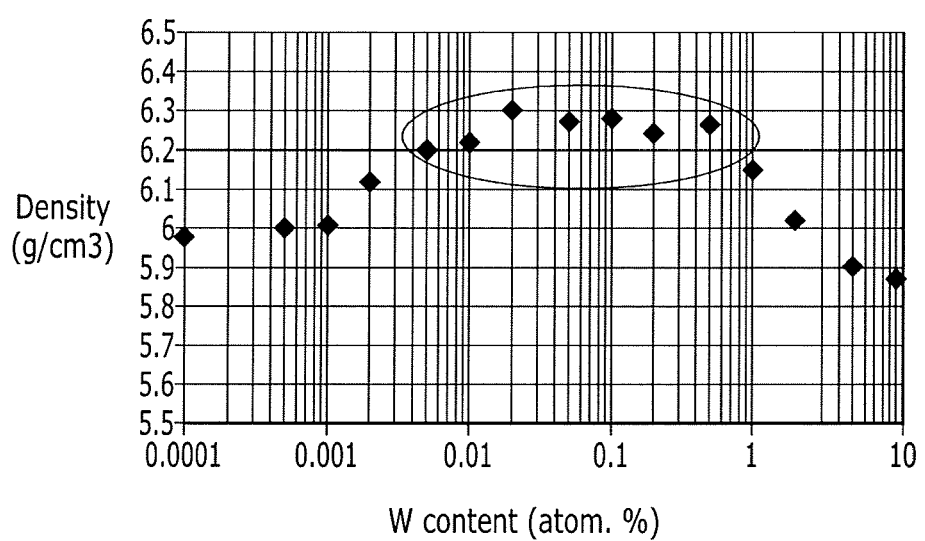
FIG. 2 is a view of measurements of density of a semiconductor thin film manufactured through a sputtering target after changing a content of tungsten in the sputtering target including indium, tin, and zinc.

FIG. 2 is a view of measurements of density of a semiconductor thin film manufactured through a sputtering target after changing a content of tungsten in the sputtering target including indium, tin, and zinc.

Referring to FIG. 2, when the tungsten content is less than 0.001 mol %, a significant change of the density is not generated. However, if the tungsten content is more than 0.001 mol %, the density is slowly increased, and when the tungsten content is more than 0.005 mol %, the high density appears. This increasing density trend is continued until the tungsten content reaches 1 mol %, and if the tungsten is more than 1 mol %, the decreasing density phenomenon appears. That is, as shown in the oval region of FIG. 2, when the tungsten content is from 0.005 mol % to 1 mol %, the density is increased significantly compared with the surrounding content. That is, it may be confirmed that a value range in which the tungsten content is from 0.005 mol % to 1 mol % has a threshold significance.

In the above, the case of doping tungsten to the oxide sputtering target including indium, zinc, tin, and gallium was described. However, alternatively, in an exemplary embodiment, the oxide sputtering target may include niobium (Nb) instead of tungsten.

That is, in the sputtering target according to the present exemplary embodiment, the content of indium may be from 10 mol % to 60 mol %. The content of zinc may be from 10 mol % to 65 mol %. The content of tin may be from 0.1 mol % to 60 mol %. The niobium doping concentration of the oxide sputtering target may be from 0.01 mol % to 1 mol %.

The method of forming the oxide sputtering target including niobium is the same as the previous method of forming the oxide sputtering target including tungsten.

For example, the niobium oxide ($NbO_2$) powder may be mixed and sintered with the other composition powders to be suitable for the ratio, or the niobium oxide powder combined with zinc may be formed by using an alkali solution including zinc and niobium ions, and then it may be mixed and sintered with the other composition powders to be suitable for the ratio. A niobium wire is positioned and heated on the oxide sputtering target at, for example, 1200° C. to 1500° C. to dope niobium to the oxide sputtering target by using niobium vapor.

Niobium also functions as a catalyst decreasing the activation energy like tungsten in FIG. 1. Accordingly, the ratios of indium and tin becomes similar to each other in each layer of the hexagonal close packed structure by the niobium addition and the density of the sputtering target is increased.

Figure 3:
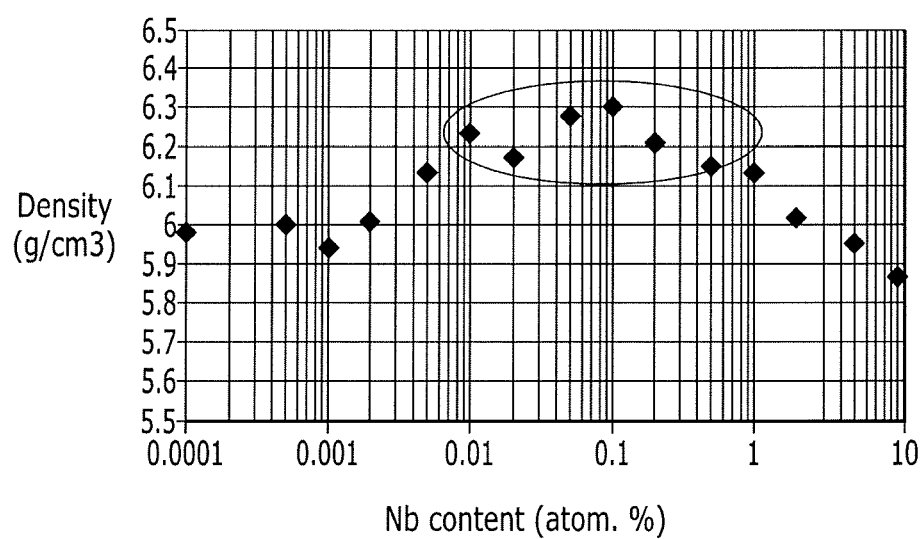
FIG. 3 is a view of measurements of density of a semiconductor thin film manufactured through a sputtering target after changing a content of niobium in the sputtering target including indium, tin, and zinc.

FIG. 3 is a view of measurements of density of a semiconductor thin film manufactured through a sputtering target after changing a content of niobium in the sputtering target including indium, tin, and zinc.

Referring to FIG. 3, when the niobium content is less than 0.001 mol %, a significant change of the density is not generated. However, if the niobium content is more than 0.001 mol %, the density is slowly increased, and when the niobium content is more than 0.01 mol %, the high density appears. This increasing density trend is continued until the niobium content reaches 1 mol %, and if the niobium is more than 1 mol %, the decreasing density phenomenon appears. That is, as shown in the oval region of FIG. 3, when the niobium content is from 0.01 mol % to 1 mol %, the density is increased significantly compared with the surrounding content. That is, it may be confirmed that a value range in which the niobium content is from 0.01 mol % to 1 mol % has a threshold significance. This range is a narrow range compared with the tungsten (0.005 mol % to 1 mol %), and it is determined that this is because the tungsten oxide ($WO_3$) has three oxygen atoms, and that the niobium oxide of $NbO_2$) has only two oxygen atoms. That is, tungsten has more oxygen atoms for one oxide molecule such that the same effect is obtained by the small content compared with niobium.

In the above, the case of doping tungsten or niobium to the oxide sputtering target including indium, zinc, tin, and gallium was described. However, alternatively, in an exemplary embodiment, the oxide sputtering target may include indium, zinc, tin, gallium, and thallium. That is, in the case including tungsten or niobium to the sputtering target including thallium, indium, zinc, tin, and gallium, the increasing density effect of the oxide sputtering target and the thin film formed therefrom may be obtained.

Thallium (Tl) is included in group 3B of the periodic table, like indium (In). Thallium has the same number of valence electrons as indium such that their lattice structures are similar. However, S-orbital of Thallium is larger than that of indium. The S-orbital is larger in thallium such that an electron path is well formed.

The oxide sputtering target according to the present exemplary embodiment is the same as in the description for the previous oxide sputtering target except for additionally including thallium. The detailed description for similar content is therefore omitted.

That is, in the sputtering target according to the present exemplary embodiment, a sum of the contents of indium and thallium may be from 10 mol % to 60 mol %. The content of zinc may be from 10 mol % to 65 mol %. The content of tin may be from 0.1 mol % to 60 mol %. The tungsten doping concentration of the oxide sputtering target may be from 0.005 mol % to 0.1 mol %.

Figure 4:
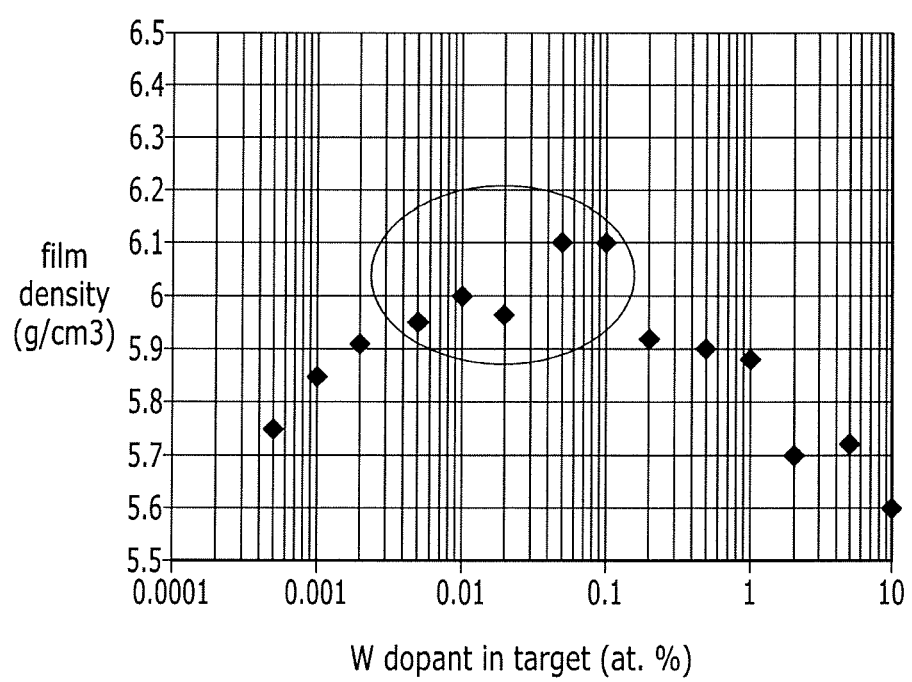
FIG. 4 is a view of measurements of density of a semiconductor thin film manufactured through a sputtering target after changing a content of tungsten in the sputtering target including thallium, indium, tin, and zinc.

FIG. 4 is a view of measurements of density of a semiconductor thin film manufactured through a sputtering target after changing a content of tungsten in the sputtering target including thallium, indium, tin, and zinc.

Referring to FIG. 4, in the case that the tungsten content is more than 0.005 mol %, a very low increase of density appears. This increasing density trend is continued until the tungsten content reaches 0.1 mol %, and if the tungsten is more than 0.1 mol %, the decreasing density phenomenon appears. That is, as shown in the oval region of FIG. 4, when the tungsten content is from 0.005 mol % to 0.1 mol %, the density increases significantly compared with the surrounding content. That is, it may be confirmed that a value range in which the tungsten content is from 0.005 mol % to 0.1 mol % has a threshold significance.

Also, for the sputtering target according to the present exemplary embodiment of the present invention, niobium may be doped to the sputtering target including thallium, indium, zinc, tin, and gallium. The oxide sputtering target according to the present exemplary embodiment is the same as that of the previous oxide sputtering target except for doping niobium instead of tungsten. The detailed description for the similar content is therefore omitted.

That is, in the sputtering target according to the present exemplary embodiment, a sum of the contents of indium and thallium may be from 10 mol % to 60 mol %. The content of zinc may be from 10 mol % to 65 mol %. The content of tin may be from 0.1 mol % to 60 mol %. The niobium doping concentration of the oxide sputtering target may be from 0.001 mol % to 1 mol %.

Figure 5:
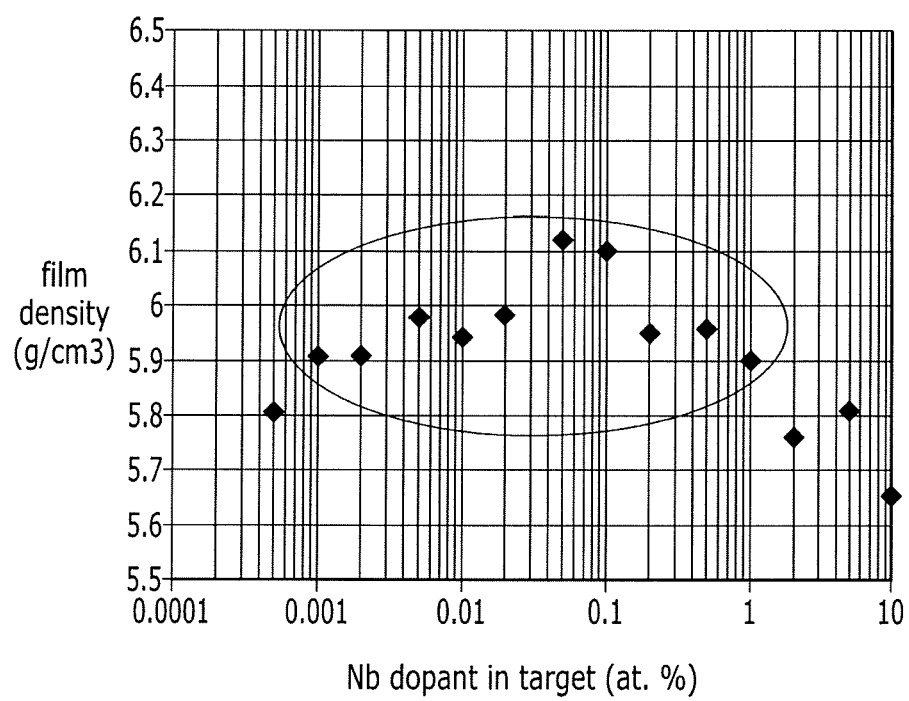
FIG. 5 is a view of measurements of density of a semiconductor thin film manufactured through a sputtering target after changing a content of niobium in the sputtering target including thallium, indium, tin, and zinc.

FIG. 5 is a view of measurements of density of a semiconductor thin film manufactured through a sputtering target after changing a content of niobium in the sputtering target including thallium, indium, tin, and zinc.

Referring to FIG. 5, when the niobium content is less than 0.001 mol %, a significant change of the density is not generated. However, if the niobium content is more than 0.001 mol %, the density is slowly increased. This increasing density trend is continued until the niobium content reaches 1 mol %, and if the niobium is more than 1 mol %, the decreasing density phenomenon appears. That is, as shown in the oval region of FIG. 5, when the niobium content is from 0.001 mol % to 1 mol %, the density is increased significantly compared with the surrounding content. That is, it may be confirmed that a value range in which the niobium content is from 0.001 mol % to 1 mol % has a threshold significance.

Next, a thin film transistor including a semiconductor thin film formed by using the sputtering target according to an exemplary embodiment of the present invention will be described.

Figure 6:
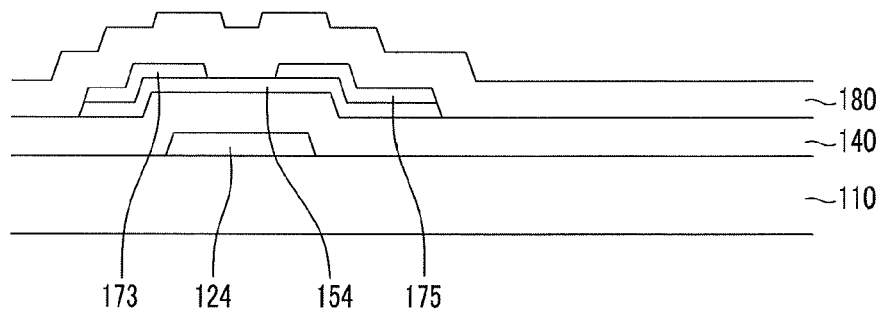
FIG. 6 is a cross-sectional view of a thin film transistor according to an exemplary embodiment of the present invention.

FIG. 6 is a cross-sectional view of a thin film transistor according to an exemplary embodiment of the present invention.

A gate electrode 124 is positioned on a substrate 110. The substrate 110 may be an insulation substrate and may include, for example, plastic, quartz or glass. Further, in an exemplary embodiment, the substrate 110 may be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The gate electrode 124 may be made of, for example, an aluminum-based metal of aluminum (Al) or aluminum alloys, a silver-based metal of silver (Ag) or silver alloys, a copper-based metal of copper (Cu) or copper alloys such as CuMn, a molybdenum-based metal of molybdenum (Mo) or molybdenum alloys, chromium (Cr), tantalum (Ta), titanium (Ti), etc. Also, the gate electrode 124 may be made of, for example, a transparent conductive material such as ITO (indium tin oxide), IZO (indium zinc oxide), AZO (aluminum doped ZnO), and CTO (cadmium tin oxide).

In the present exemplary embodiment, the gate electrode 124 is formed as a single layer, but exemplary embodiments are not limited thereto. For example, alternatively, in an exemplary embodiment, the gate electrode 124 may be formed as a double layer or a triple layer.

When being formed as a double layer, the gate electrode 124 may be formed as a lower layer and an upper layer, and the lower layer may be made of, for example, one selected among a molybdenum-based metal including molybdenum (Mo), a molybdenum alloy, chromium (Cr), a chromium alloy, titanium (Ti), a titanium alloy, tantalum (Ta), a tantalum alloy, manganese (Mn), and a manganese alloy. The upper layer may be made of, for example, one selected among an aluminum-based metal including aluminum (AL) and an aluminum alloy, a silver-based metal including silver (Ag) and a silver alloy, and a copper-based metal including copper (Cu) and a copper alloy. In case of a triple layer, layers having different physical properties are formed to be adjacent to each other.

A gate insulating layer 140 is formed on the gate line including the gate electrode 124. The gate insulating layer 140 may contain an organic insulating material such as, for example, a silicon oxide, a silicon nitride, a silicon oxynitride (SiON), aluminum oxide (AlOx), yttrium oxide ($Y_2O_3$), hafnium oxide (HfOx), zirconium oxide (ZrOx), aluminum oxynitride (AlNO), titanium oxide (TiOx), barium titanate ($BaTiO_3$), lead titanate ($PbTiO_3$), or a combination thereof. The gate insulating layer 140 may have, for example, a multi-layered structure in which two or more insulating layers are included. For example, the gate insulating layer 140 may be formed such that its upper part is made of a silicon oxide while its lower part is made of a silicon nitride, or such that its upper part is made of a silicon oxide while its lower part is made of a silicon oxynitride (SiON). When the gate insulating layer 140 that contacts an oxide semiconductor layer 154 contains oxides, degradation of a channel layer may be prevented.

The oxide semiconductor layer 154 is positioned on the gate insulating layer 140.

The oxide semiconductor layer 154 according to the present exemplary embodiment may be formed by using the described oxide sputtering target. At this time, the composition of the formed oxide semiconductor layer is the same as the composition of the used oxide sputtering target.

Accordingly, the oxide semiconductor layer according to the present exemplary embodiment includes at least one of indium (In), zinc (Zn), tin (Sn), and gallium (Ga), and may include tungsten (W) at 0.005 mol % to 1 mol %. In this case, the indium content may be from 10 mol % to 60 mol %, the zinc content may be from 10 mol % to 65 mol %, and the tin content may be 0.1 mol % to 60 mol %.

Also, the oxide semiconductor layer includes at least one of indium (In), zinc (Zn), tin (Sn), and gallium (Ga), and may include niobium (Nb) at 0.01 mol % to 1 mol %. In this case, the indium content may be from 10 mol % to 65 mol %, the zinc content may be from 10 mol % to 60 mol %, and the tin content may be from 0.1 mol % to 60 mol %.

Also, the oxide semiconductor layer includes at least one among thallium (Tl), indium (In), zinc (Zn), tin (Sn), and gallium (Ga), and may include tungsten (W) at 0.005 mol % to 0.1 mol %. At this time, the sum of the contents of thallium and indium may be from 10 mol % to 60 mol %, the zinc content may be from 10 mol % to 65 mol %, and the tin content may be from 0.1 mol % to 60 mol %.

Also, the oxide semiconductor layer includes at least one among thallium (Tl), indium (In), zinc (Zn), tin (Sn), and gallium (Ga), and may include niobium at 0.001 mol % to 1 mol %. In this case, the indium content may be from 10 mol % to 65 mol %, the zinc content may be from 10 mol % to 60 mol %, and the tin content may be from 0.1 mol % to 60 mol %.

Further, in this case, the semiconductor layer 154 may be heat-treated to have a semiconductor property while already having an insulating property. The heat treatment temperature may be from about 350° C. to about 550° C. This is because an amorphous property can be lost if the heat treatment temperature exceeds 550° C., or exhibiting the semiconductor property may be difficult when the heat treatment temperature falls below 350° C.

Next, a source electrode 173 and a drain electrode 175 facing each other on the oxide semiconductor layer 154 while exposing a channel region thereof are formed.

A passivation layer 180 is positioned on the source and drain electrodes 173 and 175 while covering the channel region of the oxide semiconductor layer 154. The passivation layer 180 may be formed of, for example, an inorganic insulating material such as, for example, a silicon nitride or a silicon oxide, or an organic insulating material. For example, the organic insulating material of the passivation layer 180 may include benzocyclobutene (BCB), an acryl-based resin or a combination thereof.

Figure 7:
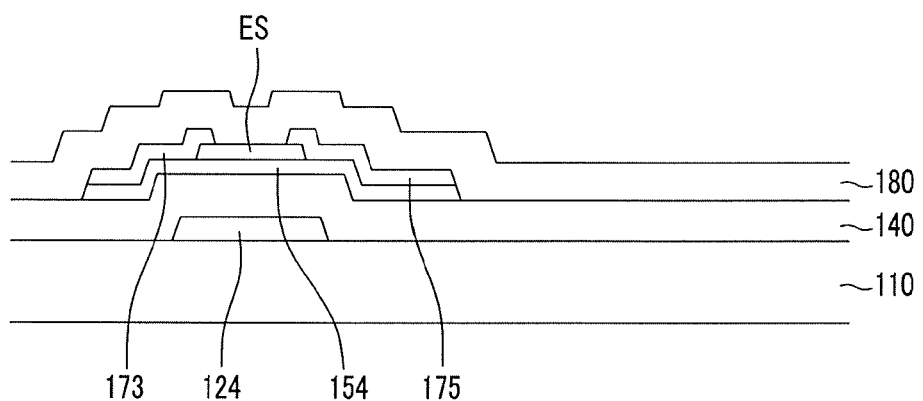
FIG. 7 is a cross-sectional view of a thin film transistor according to an exemplary embodiment of the present invention.

FIG. 7 is a cross-sectional view of a thin film transistor according to an exemplary embodiment of the present invention.

Referring to FIG. 7, unlike the thin film transistor of FIG. 6, an etch stopper is present. For example, a gate electrode 124 corresponding to a control electrode in the thin film transistor array panel is positioned on a substrate 110, and a gate insulating layer 140 is positioned on the substrate 110 to cover the gate electrode 124.

The etch stopper ES is formed at a position corresponding to the channel region of the oxide semiconductor layer 154. The source electrode 173 and the drain electrode 175 are positioned on the semiconductor layer 154 while being spaced apart from each other so as to overlap an edge of the etch stopper ES. The etch stopper ES is partially exposed at a position at which the source electrode 173 and the drain electrode 175 are spaced apart from each other. The etch stopper ES may be formed of, for example, a silicon-based oxide or nitride.

A passivation layer 180 is positioned on the source electrode 173 and the drain electrode 175. The passivation layer 180 fills a space in which the source electrode 173 and the drain electrode 175 are spaced apart from each other, and is formed so as to cover the etch stopper ES exposed through the space in which the source electrode 173 and the drain electrode 175 are spaced apart from each other.

The description in FIG. 6 except for the above difference may be generally applied to the present exemplary embodiment of FIG. 7.

Also, the thin film transistors described in FIG. 6 and FIG. 7 are bottom gate structures in which the gate electrode 124 is positioned under the semiconductor layer 154 including the channel portion, but exemplary embodiments of the present invention are not limited thereto. For example, alternatively, exemplary embodiments of the prevent invention may also be applied to a top gate structure in which the gate electrode is positioned on the semiconductor layer.

Next, an effect of a thin film transistor applied with an oxide semiconductor layer of an exemplary embodiment of the present invention will be described with reference to FIG. 8 to FIG. 11.

Figure 8:
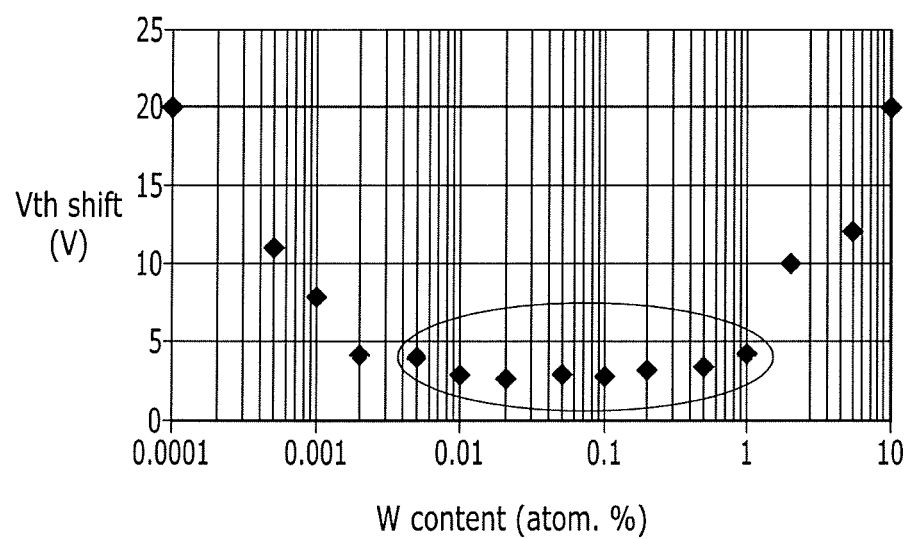
FIG. 8 shows measurement results of a threshold voltage shift (Vth shift) while changing a tungsten content of a semiconductor layer of a thin film transistor according to an exemplary embodiment of the present invention.

FIG. 8 shows measurement results of a threshold voltage shift (Vth shift) while changing a tungsten content of a semiconductor layer of a thin film transistor according to an exemplary embodiment of the present invention.

In the present experiment, the semiconductor layer includes indium, tin, and zinc.

The threshold voltage is a voltage at which the semiconductor element starts to be operated, and it is beneficial to maintain the threshold voltage with a constant level to increase the reliability of the thin film transistor.

Referring to FIG. 8, in a case that the tungsten content is increased to more than 0.005 mol %, it may be confirmed that the Vth shift is minimized. As the tungsten content is increased, the decreasing trend of the Vth shift is maintained, and when the tungsten content is larger than 1 mol %, the threshold voltage shift is increased.

That is, as shown in the oval region of FIG. 8, when the tungsten content of the semiconductor thin film is from 0.005 mol % to 1 mol %, the threshold voltage shift is minimized, and this has the threshold significance compared to the surrounding contents.

As described above, the minimization of the threshold voltage is the reason that tungsten functions as the catalyst to help indium and tin forming the semiconductor thin film exist with the uniform ratio in each layer of the hexagonal close packed structure. The ratio of the indium and tin is similar in each layer of the hexagonal close packed structure such that the ratio c/a of the hexagonal close packed structure is decreased. That is, the atoms are stacked with the further denser structure, and the density of the semiconductor thin film is increased. It is difficult for the external moisture or hydrogen to penetrate by the increasing of the density and to deform the inner atoms against the moisture or hydrogen such that the semiconductor thin film is stable. Therefore, the threshold voltage shift is decreased.

Figure 9:
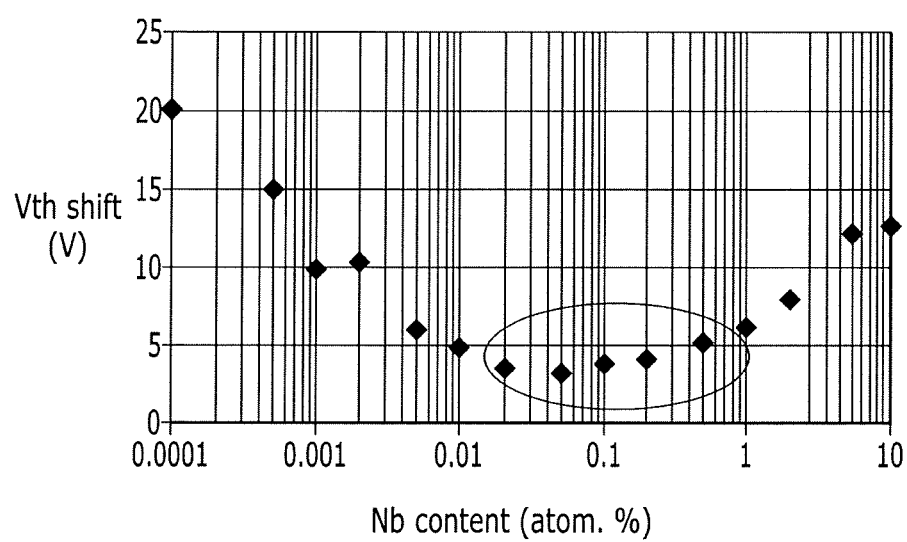
FIG. 9 shows measurement results of a threshold voltage shift (Vth shift) while changing a niobium content of a semiconductor layer of a thin film transistor according to an exemplary embodiment of the present invention.

FIG. 9 shows measurement results of a threshold voltage shift (Vth shift) while changing a niobium content of a semiconductor layer of a thin film transistor according to an exemplary embodiment of the present invention.

In the present experiment, the semiconductor layer includes indium, tin, and zinc.

Referring to FIG. 9, it may be confirmed that the Vth shift is minimized when the niobium content is increased to more than 0.01 mol %. The decreasing trend of the Vth shift according to the increasing of the niobium content is maintained, but the threshold voltage shift is increased when the niobium content is larger than 1 mol %.

That is, as shown in the oval region of FIG. 9, when the niobium content of the semiconductor thin film is from 0.01 mol % to 1 mol %, the threshold voltage shift is minimized, and this is the value range having the threshold significance compared with the surrounding content.

Figure 10:
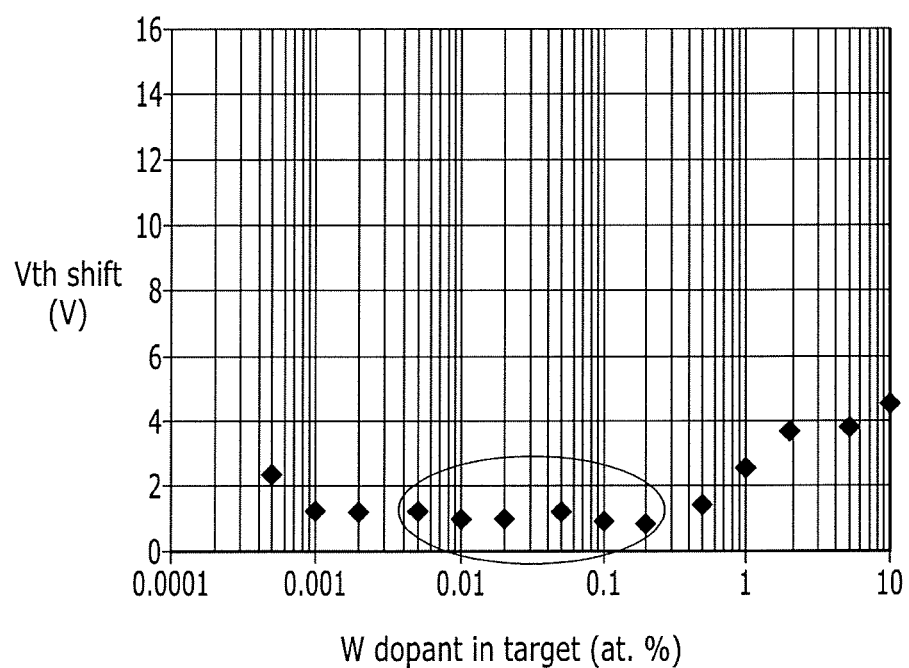
FIG. 10 shows measurement results of a threshold voltage shift (Vth shift) while changing a tungsten content of a semiconductor layer of a thin film transistor according to an exemplary embodiment of the present invention.

FIG. 10 shows measurement results of a threshold voltage shift (Vth shift) while changing a tungsten content of a semiconductor layer of a thin film transistor according to an exemplary embodiment of the present invention.

In the present experiment, the semiconductor layer includes thallium, indium, tin, and zinc.

Referring to FIG. 10, when the tungsten content is from 0.005 mol % to 0.1 mol %, the threshold voltage shift is minimized. However, it may be confirmed that the threshold voltage shift is again increased when the tungsten content is larger than 0.1 mol %. That is, as shown in the oval region of FIG. 10, in the semiconductor thin film additionally including thallium, when tungsten is included between 0.005 mol % and 0.1 mol %, the most stable performance may be obtained.

Figure 11:
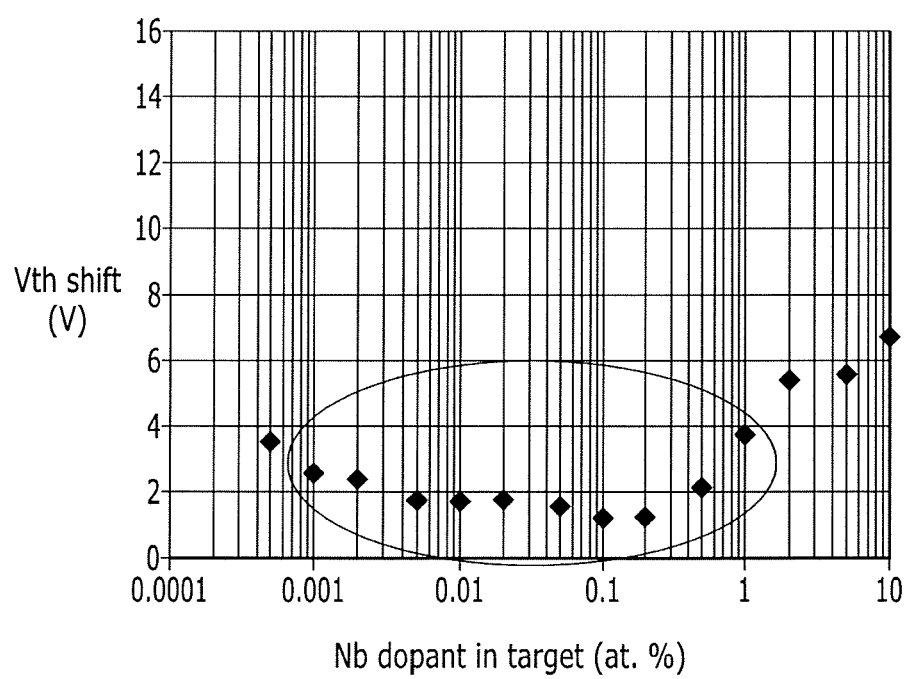
FIG. 11 shows measurement results of a threshold voltage shift (Vth shift) while changing a niobium content of a semiconductor layer of a thin film transistor according to an exemplary embodiment of the present invention.

FIG. 11 shows measurement results of a threshold voltage shift (Vth shift) while changing a niobium content of a semiconductor layer of a thin film transistor according to an exemplary embodiment of the present invention.

In the present experiment, the semiconductor layer includes thallium, indium, tin, zinc.

Referring to FIG. 11, when the niobium content is larger than 0.001 mol %, it may be confirmed that the Vth shift is minimized. The decreasing trend of the Vth shift according to the increasing of the niobium content is maintained. However, the threshold voltage shift is increased when the niobium content is larger than 1 mol %.

That is, as shown in the oval region of FIG. 11, in the semiconductor thin film additionally including thallium, when niobium is included between 0.001 mol % and 1 mol %, the most stable performance may be obtained.

As described above, the sputtering target and the semiconductor thin film according to an exemplary embodiment of the present invention includes tungsten or niobium as the catalyst to increase the density of the sputtering target such that the threshold voltage shift of the semiconductor thin film may be minimized.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. An oxide sputtering target comprising:
at least one of indium (In), zinc (Zn), tin (Sri), and gallium (Ga); and
tungsten (W) in an amount from 0.005 mol % to 1 mol %,
wherein each of the atoms in the oxide sputtering target is arranged with a hexagonal close packed structure.

2. The oxide sputtering target of claim 1, wherein an indium content is from 10 mol % to 60 mol %, a zinc content is from 10 mol % to 65 mol %, and a tin content is 0.1 mol % to 60 mol %.

3. An oxide sputtering target comprising:
at least one of thallium (Ti), indium (In), zinc (Zn), tin (Sn), and gallium (Ga); and
tungsten (W) in an amount from 0.005 mol % to 0.1 mol %;
wherein each of the atoms in the oxide sputtering target is arranged with a hexagonal close packed structure.

4. The oxide sputtering target of claim 3, wherein a sum of contents of thallium and indium is 10 mol % to 60 mol %, a zinc content is from 10 mol % to 65 mol %, and a tin content is from 0.1 mol % to 60 mol %.

* * * * *